(12) United States Patent
Montgomery et al.

(10) Patent No.: US 10,886,486 B1
(45) Date of Patent: Jan. 5, 2021

(54) QLED WITH ASYMMETRICAL QUANTUM EMITTERS

(71) Applicant: Sharp Kabushiki Kaisha, Osaka (JP)

(72) Inventors: David James Montgomery, Oxford (GB); Enrico Angioni, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 36 days.

(21) Appl. No.: 16/531,364

(22) Filed: Aug. 5, 2019

(51) Int. Cl.
    *H01L 51/50*    (2006.01)
    *H01L 51/56*    (2006.01)
    *H01L 51/52*    (2006.01)
    *H01L 51/00*    (2006.01)

(52) U.S. Cl.
CPC ........ *H01L 51/502* (2013.01); *H01L 51/5064* (2013.01); *H01L 51/5072* (2013.01); *H01L 51/5293* (2013.01); *H01L 51/56* (2013.01); *H01L 51/0035* (2013.01); *H01L 51/0037* (2013.01); *H01L 51/0043* (2013.01); *H01L 2251/303* (2013.01); *H01L 2251/5369* (2013.01)

(58) Field of Classification Search
CPC .............. H01L 51/502; H01L 51/5064; H01L 51/5072; H01L 51/5293; H01L 51/56
See application file for complete search history.

(56) References Cited

U.S. PATENT DOCUMENTS

| | | | |
|---|---|---|---|
| 7,324,574 B2 | 1/2008 | Kim | |
| 8,471,268 B2 | 6/2013 | Moon et al. | |
| 8,581,230 B2 | 11/2013 | Kim et al. | |
| 8,894,243 B2 | 11/2014 | Cho et al. | |
| 9,583,727 B2 | 2/2017 | Cho et al. | |
| 9,963,633 B2 | 5/2018 | Dubertret et al. | |
| 10,197,853 B2 | 2/2019 | Lee et al. | |
| 10,243,023 B2 | 3/2019 | Hack et al. | |
| 2006/0158098 A1 | 7/2006 | Raychaudhuri et al. | |
| 2014/0014896 A1 | 1/2014 | Chung et al. | |
| 2015/0084012 A1 | 3/2015 | Kim et al. | |
| 2016/0356456 A1 | 12/2016 | Mahler et al. | |
| 2017/0207281 A1 | 7/2017 | Hack et al. | |
| 2019/0067618 A1* | 2/2019 | Xiao | H01L 51/5234 |
| 2020/0328366 A1* | 10/2020 | Layton | H01L 31/03845 |

FOREIGN PATENT DOCUMENTS

| | | |
|---|---|---|
| KR | 1020170079328 | 7/2017 |
| WO | WO 2017/205174 | 11/2017 |

* cited by examiner

*Primary Examiner* — Allan R Wilson
(74) *Attorney, Agent, or Firm* — Renner, Otto, Boisselle & Sklar, LLP

(57) ABSTRACT

A light-emitting layer structure that improves the optical extraction efficiency using asymmetrical quantum dots aligned with a plane of the layer structure is provided. The structure includes a substrate; a first electrode layer deposed on the substrate; a first charge transport layer deposited on the first electrode layer; an emissive layer (EML) deposited on the first charge transport layer; a second charge transport layer deposited on the EML; and a second electrode layer deposited on the second charge transport layer; wherein the EML includes asymmetrical quantum dot nanoparticles, and each nanoparticle has a major axis longer than a first minor axis and a second minor axis, both the first minor axis and the second minor axis being orthogonal to the major axis, and wherein the major axis of each of the nanoparticles of the plurality of nanoparticles is aligned parallel to a plane of the EML.

19 Claims, 11 Drawing Sheets

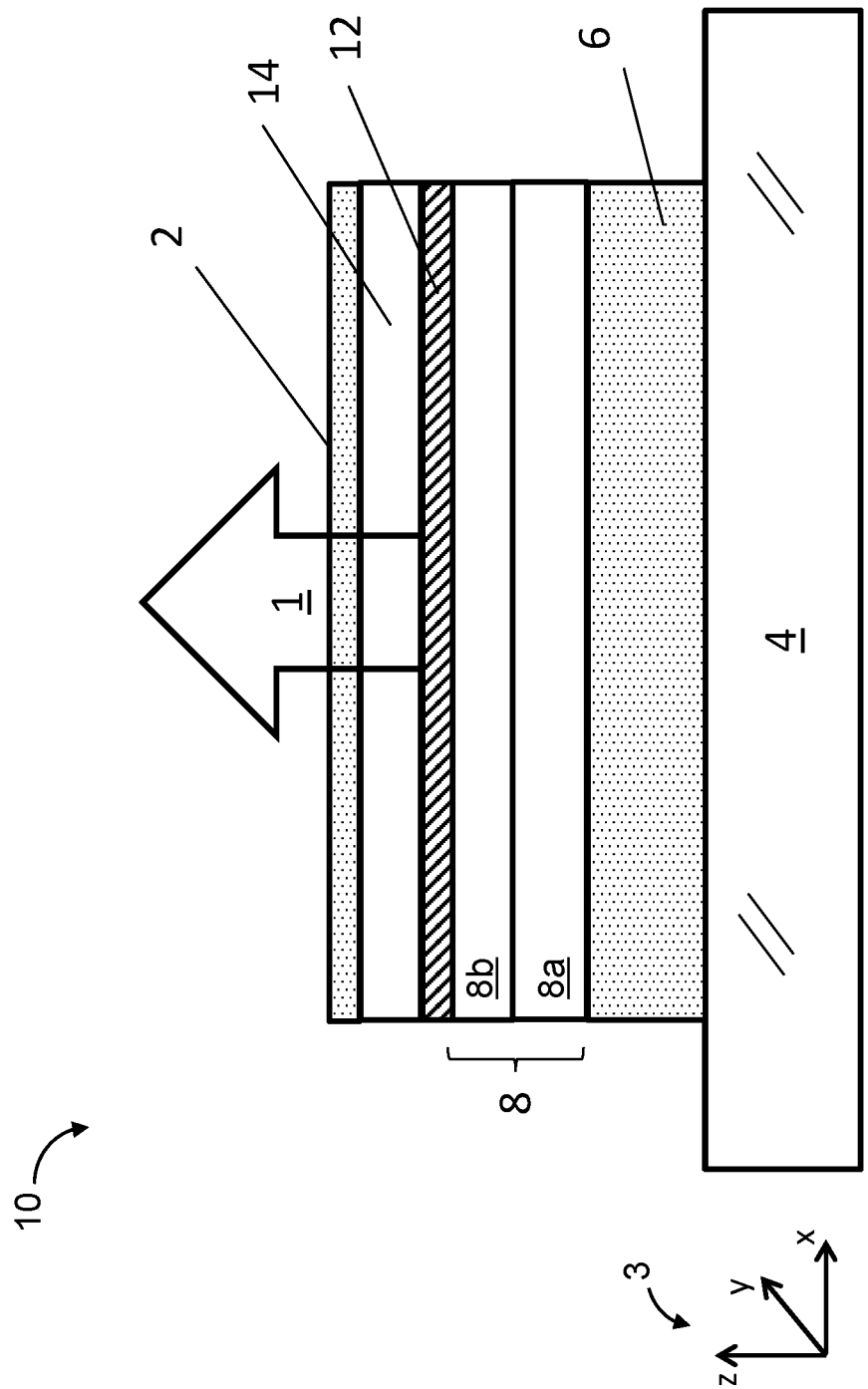

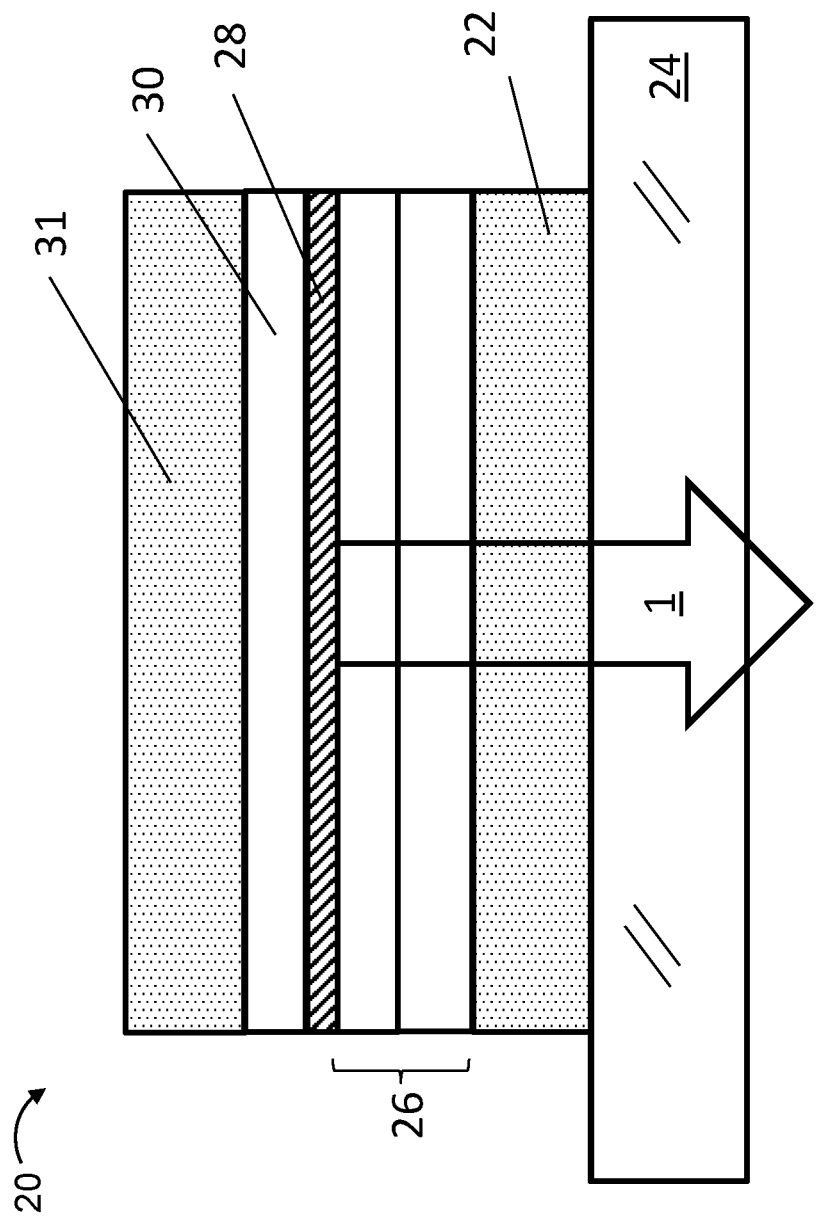

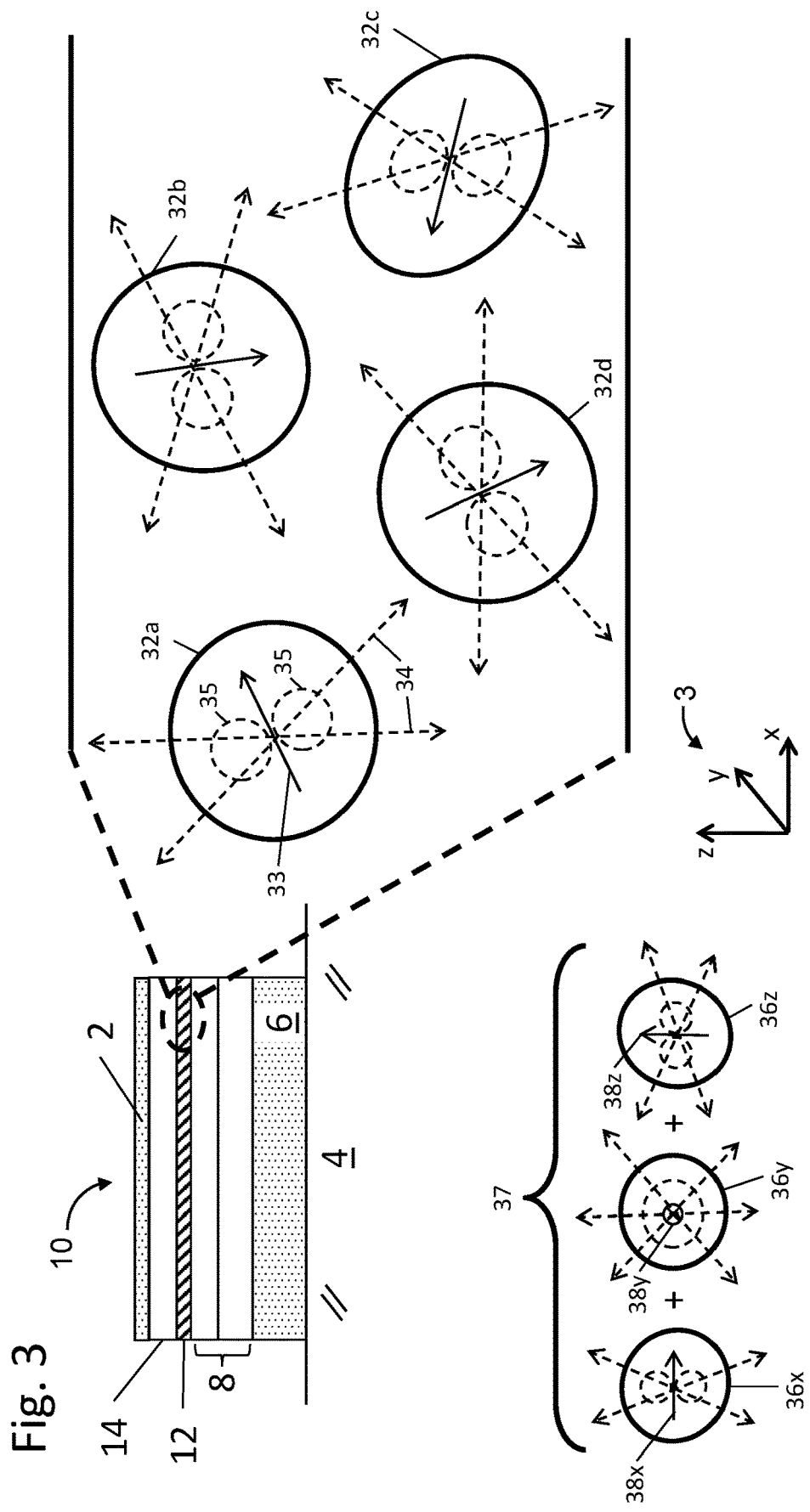

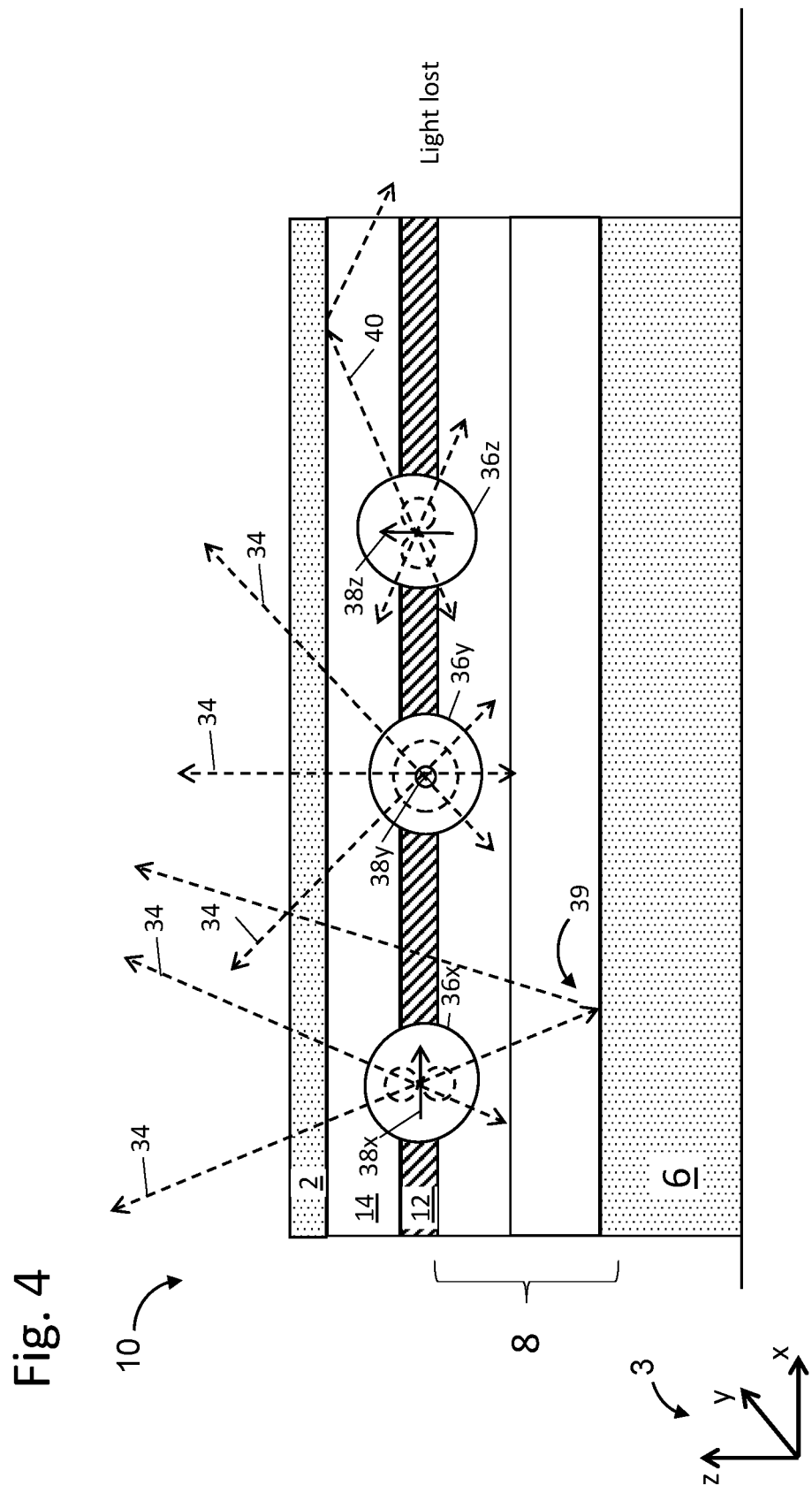

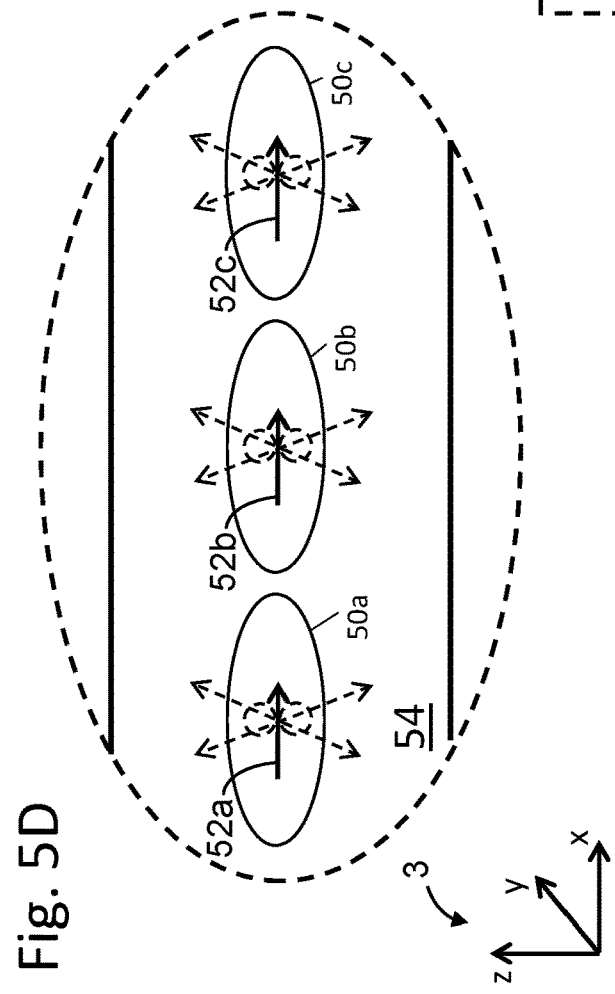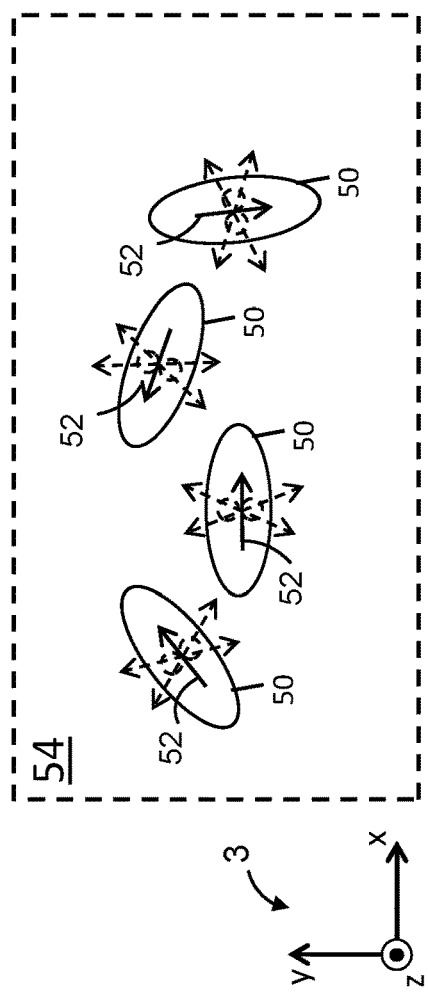

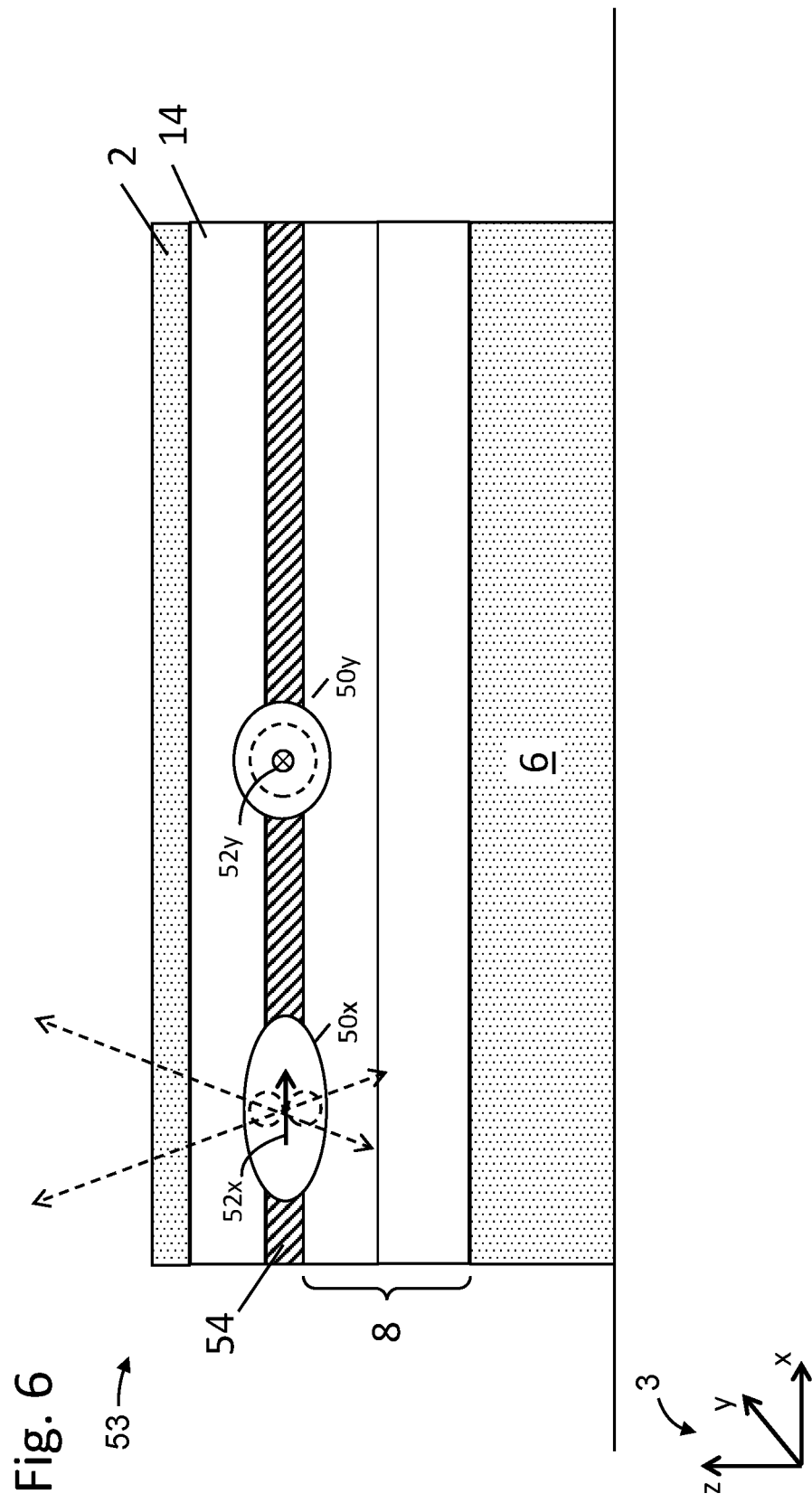

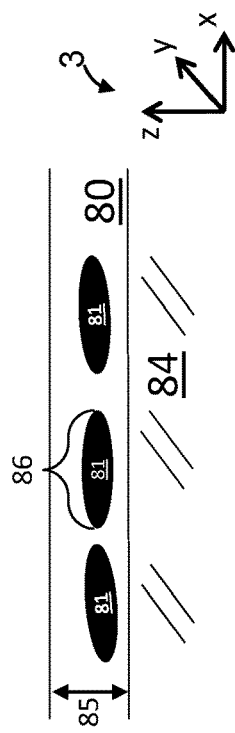
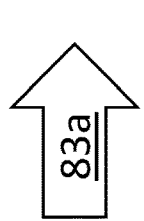
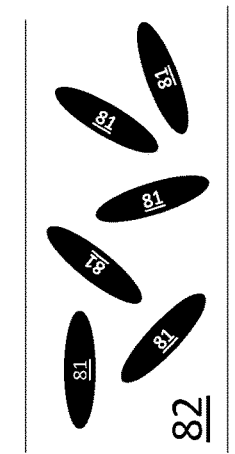
Fig. 8A
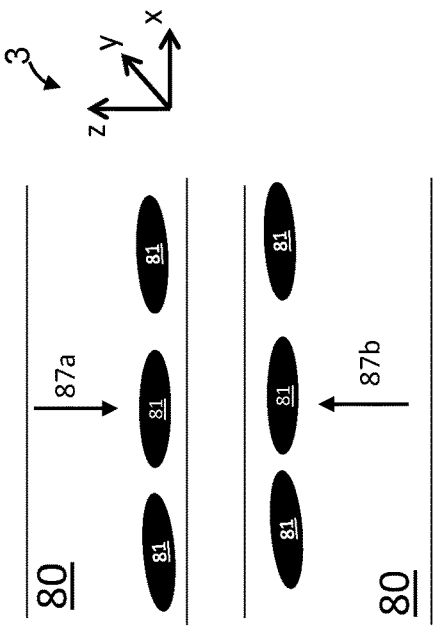
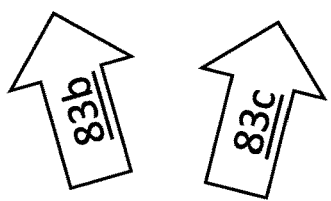
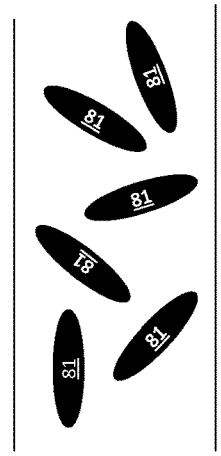
Fig. 8B

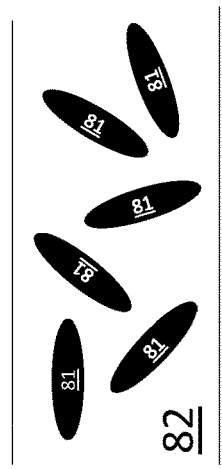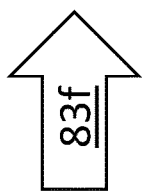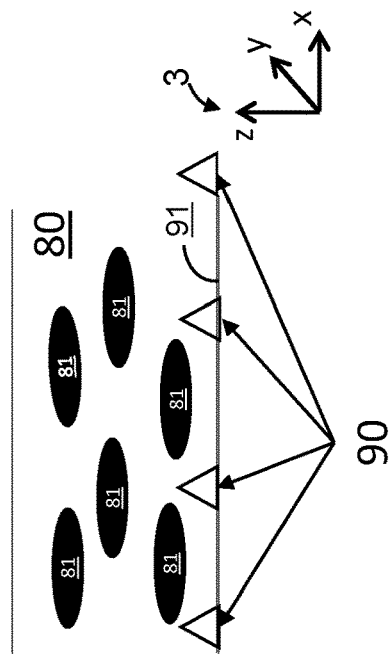
Fig. 8E

QLED WITH ASYMMETRICAL QUANTUM EMITTERS

TECHNICAL FIELD

The present invention relates to the field of light-emitting layer structures used in emissive display devices, and in particular quantum dot (QD) light emitting diode (QLED) displays.

BACKGROUND ART

Cavities are well known in semiconductor laser fabrication as described in U.S. Pat. No. 7,324,574 (Kim, issued Jan. 29, 2008). The use of cavities with organic LEDs (OLEDs) and QLEDs is also known as shown in US 2006/0158098 (Raychaudhuri et al., published Jul. 20, 2006), U.S. Pat. No. 9,583,727 (Cho et al., issued Feb. 28, 2017), and U.S. Pat. No. 8,471,268 (Moon et al., issued Jun. 25, 2013). Raychaudhuri et al. describe a top emitting OLED structure, and Cho et al. and Moon et al. describe QLED structures with light emitting regions between reflective areas, one of which is partially transmitting.

Methods for improving the luminance of such cavities, such as US 2015/0084012 (Kim et al, published Mar. 26, 2015), describe the use of dispersive layers in an OLED structure. U.S. Pat. No. 8,894,243 (Cho et al., issued Nov. 25, 2014) describes the use of microstructure scattering for improving efficiency. WO 2017/205174 (Freier et al., published Nov. 30, 2017) and U.S. Pat. No. 8,581,230 (Kim et al., issued Nov. 12, 2013) describe methods for enhancement of emission by use of surface plasmon nanoparticles or nanostructures in the charge transport layers.

US 2014/0014896 (Chung et al., published Jan. 16, 2014) describes a QLED structure with a thick electron transport layer to facilitate charge injection but does not specify an ideal thickness of said layer. U.S. Ser. No. 10/243,023 (Hack et al., issued Mar. 26, 2019) and an associated continuation-in-part, US 2017/0207281 (Hack et al., published Jul. 20, 2017), describe OLED color pixels with different optical path lengths, although no specific description is set forth that particularly instructs how the different optical pathways exactly would be achieved.

In such OLED and QLED devices, emission is due to an electron/hole pair recombination in the emissive area and creating a dipole for electromagnetic emission (particularly light emission). These dipole axes are generally randomly directed, and for OLEDs, the molecules are randomly arranged in the emissive layer and the quantum dots are generally spherical. The random nature of the dipole axes results in substantial loss of light output, which undermines output efficiency. Non-spherical quantum dots are known in the prior art to provide various effects on the light emission, but other than to enhance the output efficiency. For example, KR 1020170079328 (Lee et al., Published Jul. 10, 2017) describes the use of quantum rod LEDs to create polarized backlight emission. U.S. Ser. No. 10/197,853 (Lee et al., issued Feb. 5, 2019) combines quantum rods with the use of phosphors for high colour purity. U.S. Pat. No. 9,963,633 (Dubertret et al., issued May 8, 2018) describes quantum disks where one dimension is smaller than the other two dimensions, and US 2016/0356456 (Mahler et al., published Dec. 8, 2016) describes the use of quantum disks in an LED where axes normal to the disks are substantially parallel.

SUMMARY OF INVENTION

There is a need in the art, therefore, for increased efficiency and improved brightness for light emitting structures that use quantum dots (QDs). The present invention provides a specific arrangement for an emissive display using a QD electroluminescent material in an LED arrangement. This arrangement typically includes a layer of an emissive material disposed between an electron transport layer (ETL) and a hole transport layer (HTL). This stack is then disposed between two conducting layers that act as electrodes, one side of which is formed on a glass substrate. The light-emitting layer structure employs asymmetrical quantum dots (AQDs) in the emissive layer to enhance the efficiency of the light emission.

Embodiments of the present application may be implemented in top emitting (TE) structures in which the emission is from the side opposite of the glass substrate layer. Embodiments of the present application also are applicable to "inverted" structures for which the layer sequence is substrate/cathode/ETL/QD emissive layer/HTL/anode. In exemplary embodiments, the emission optical dipole alignment is limited in directions normal to the plane of the layer structure of the light-emitting device, with an emissive material including nanoparticles such as asymmetrical quantum dots, which may also be referred to as quantum rods or nanowires. These nanoparticles are extended in one direction so that emission is more concentrated with a dipole axis along the extension. These particles are arranged so that the extension direction is parallel to the plane of the emissive layer, whereby the dipole emission with an axis normal to the plane is then minimized, increasing overall efficiency. Principles of the present application also may be applied to bottom emitting (BE) structures in which light is emitted through a transparent glass substrate.

An aspect of the invention, therefore, is light-emitting structure that employs asymmetrical quantum dots (AQDs) in the emissive layer to enhance the efficiency of the light emission. In exemplary embodiments, a light-emitting layer structure includes a substrate; a first electrode layer deposited on the substrate; a first charge transport layer deposited on the first electrode layer; an emissive layer (EML) deposited on the first charge transport layer; a second charge transport layer deposited on the EML; and a second electrode layer deposited on the second charge transport layer. The EML includes a plurality of asymmetrical quantum dot nanoparticles, and each nanoparticle of the plurality of nanoparticles has a major axis longer in a first direction than a first minor axis in a second direction and second minor axis in a third direction, both the first minor axis and the second minor axis being orthogonal to the major axis, and wherein the major axis of each of the nanoparticles of the plurality of nanoparticles is aligned substantially parallel to a plane of the EML. An axis of a nanoparticle is substantially parallel to the EML if the axis is within +/−20° of the plane of the EML.

The major axis of each of the nanoparticles of the plurality of nanoparticles may be aligned specifically in a first direction, and the first direction is within the plane of the EML, whereby dipole axes of the nanoparticles are within the plane of the emissive layer. The first minor axis of each of the nanoparticles of the plurality of nanoparticles further may be aligned in a second direction and the second direction also is in the plane of the EML, which permits the emission of light polarized in a specific direction.

Another aspect of the invention is a method of forming an emissive layer (EML) for use in a light-emitting device. In exemplary embodiments, the method includes the steps of: forming a solution including a plurality of asymmetrical quantum dot nanoparticles, and each nanoparticle of the plurality of nanoparticles has a major axis longer than a first minor axis and a second minor axis, both the first minor axis and the second minor axis being orthogonal to the major axis; depositing the solution on a charge transport layer; and curing the solution to form the EML layer, wherein curing the solution aligns the major axis of each of the nanoparticles of the plurality of nanoparticles substantially parallel to a plane of the EML in a first direction. The nanoparticles further may be aligned in a second direction within the plane by the EML by, as part of the curing process, applying an electric field to the solution, applying a magnetic field to the solution, applying polarized light to the solution, or forming one or more structures on an interface of the EML and the charge transport layer, which align the major axes of the plurality of nanoparticles in the second direction.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 1 is a drawing depicting an exemplary top emitting light-emitting device structure.

FIG. 2 is a drawing depicting an exemplary bottom emitting light-emitting device structure.

FIG. 3 is a drawing depicting the dipole emission from representative quantum dots in a conventional emissive layer structure having spherical quantum dots.

FIG. 4 is a drawing depicting an approximation of an array of random dipoles in which emission is modelled as three orthogonal dipoles in a conventional emissive layer structure.

FIGS. 5A, 5B, 5C, 5D and 5E are drawings depicting asymmetric quantum dots in a layer structure in accordance with embodiments of the present invention.

FIG. 6 is a drawing depicting dipoles of asymmetric quantum dots aligned in various directions.

FIGS. 8A, 8B, 8C, 8D, and 8E are drawings that depict various configurations of, and methods of forming of, asymmetrical quantum dots in accordance with embodiments of the present invention.

DESCRIPTION OF EMBODIMENTS

Figure 5C:
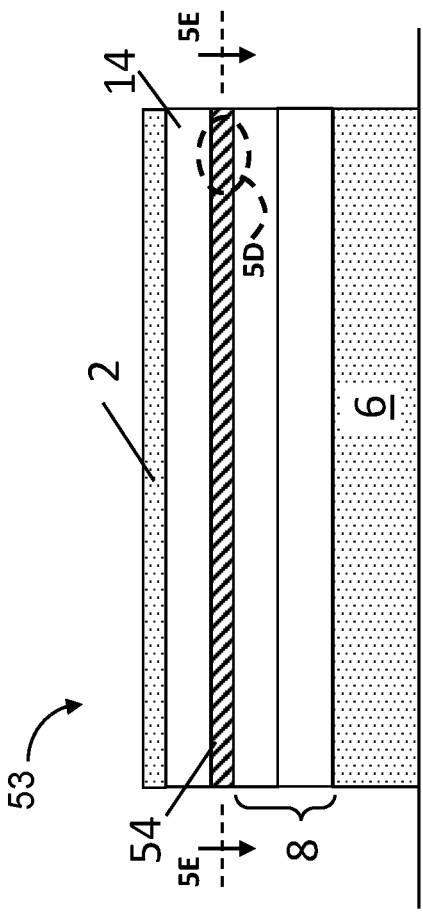

Embodiments of the present invention will now be described with reference to the drawings, wherein like reference numerals are used to refer to like elements throughout. It will be understood that the figures are not necessarily to scale.

FIG. 1 is a drawing depicting an exemplary top emitting (TE) light-emitting device structure 10. The TE structure 10 emits light 1 through a top layer 2 that is a partial reflector electrode formed opposite from a substrate 4. The substrate 4 may be a glass substrate on which a bottom reflector electrode 6 is formed. The thickness of the bottom reflector electrode 6 may be greater than 80 nm. The bottom reflector electrode 6 may be a metallic material reflector which is also used as an electrode. The bottom reflector 6 is typically aluminium, silver, Indium Tin Oxide (ITO), and the like or a combination thereof. A hole transport layer (HTL) 8 may be formed on the bottom reflector 6. The HTL 8 may include two layers, a first HTL sub-layer 8a formed using a material such as PEDOT:PSS, and a second HTL sub-layer 8b formed using a material characterized by a high hole mobility such as TFB (Poly(9,9-dioctylfluorene-alt-N-(4-sec-butylphenyl)-diphenylamine). An emissive layer (EML) 12 may be formed on the HTL 8. As further detailed below, in accordance with embodiments of the present invention, the EML 12 include light-emitting nanoparticles configured as asymmetrical quantum dots, which also may be referred to and quantum rods or nanowires. An electron transport layer (ETL) 14 may be formed on the EML 12. The ETL 14 may be formed using a material characterized by electron mobility such as nanoparticle Zinc Oxide. The top electrode layer 2 is a thin metal layer such as silver, Magnesium-Silver alloy, and the like. FIG. 1 also shows an xyz-coordinate system 3 that will be used throughout the description. When an electric field is applied across the electrodes layers 2 and 6, electrons and holes are generated by the electrodes and transported through the ETL 14 and HTL 8, where the electrons and holes recombine within the nanoparticles of the emissive layer 12 to emit light.

The configuration of FIG. 1 may be referred to in the art as a "normal structure", with the electrode layer 6 closest to the substrate constituting the anode, and the electrode layer 2 farthest from the substrate constituting the cathode. An alternative configuration is referred to in the art as an "inverted structure", in which the electrode layer 6 closest to substrate constitutes the cathode and the electrode layer 2 farthest from the substrate constitutes the anode. In an inverted structure, the charge transport layer 8 is the ETL and the charge transport layer 14 is HTL. Accordingly, the ETL and HTL may be referred to herein more generally as first and second charge transport layers (CTL) as appropriate.

FIG. 2 is a drawing depicting an exemplary bottom emitting (BE) light-emitting device structure 20. The BE structure 20 emits light 1 through a bottom electrode layer 22 and a transparent substrate 24. The BE structure 20 includes an HTL 26, an emissive layer (EML) 28, and an ETL 30 that are similar to or composed comparably as the layers formed in the TE structure 10. The BE structure 20 includes a top reflector electrode 31 that may be a thick opaque metal layer. The bottom reflector 22 may be a partial reflector so as to transmit light, such as Indium Tin Oxide (ITO). The use of a partial reflector such as ITO that is substantially more transmissive than thin metal layers facilitates the fabrication of thicker electrodes to serve as the bottom reflector electrode 22. The example of FIG. 2 also is depicted as a normal structure, although a BE device also may be configured as an inverted structure as described above with respect to FIG. 1.

The present invention can apply equally to top and bottom emitting structures as the formation of the electrodes does not impact operations as related to the principles of the present application. The following description generally is in connection with top emitting structures, but embodiments of the present invention described herein may also be used in bottom emitting structures.

FIG. 3 is a drawing depicting dipole emission from representative quantum dots in a conventional emissive layer structure. FIG. 3 shows a representative view of quantum dots 32 in the emissive layer 12. In general, recombination between a hole and an electron determines the dipole axis 33 of emission. Dipole emission 34, including an optical emission distribution 35, varies as the sine of the polar angle away from the dipole axis 33 and is cylindrically symmetric about the axis (forming a toroidal emission pattern). Accordingly, the dipole emission 34 is greatest at 90 degrees from the dipole axis 33 of emission, and is illustrated herein at angles perpendicular to the dipole axis 33 of emission. In the conventional configuration of FIG. 3, the quantum dots 32 are, in general, spherical. Thus, the dipole axes for each emission are randomly arranged in the EML 12. Generally, it is not possible to control the dipole axis for a spherical quantum dot. Also, each individual dipole is not coherent in terms of phase with light emitted from any other dipole in the emissive layer.

Accordingly, a large randomly oriented array of dipoles in the conventional configurations can be understood as an incoherent superposition 37 of three equal strength dipoles, with each dipole axis 38 in an orthogonal direction to each of the others. An idealization of an array of random dipoles may be simulated as three orthogonal dipoles, for example, a first representative dipole 36x has a dipole axis 38x oriented in the X-direction, a second representative dipole 36y has a dipole axis 38y oriented in the Y-direction, and a third representative dipole 36z has a dipole axis 38z oriented in the Z-direction. Prediction of the performance of such layers can then be understood as an incoherent superposition of three coherently simulated dipoles in an X, Y, and Z direction. Emission from each representative dipole is characterized by a polarization in the direction of the associated dipole axis and is added in the far field incoherently.

FIG. 4 is a drawing depicting an approximation of an array of random dipoles in which this emission is modelled as three orthogonal dipoles as illustrated in FIG. 3 in a conventional emissive layer structure. FIG. 4 shows the representative dipoles axes 38 simulated in the layer structure 10. The figure shows that for the first representative dipole 36x with the axis 38x oriented in the X-direction (for which light associated with the dipole emission 34 is strongest in the Y-Z plane) and the second representative dipole 36y with the axis 38y oriented in the Y-direction (for which light associated with the dipole emission 34 is strongest in the X-Z plane), a significant fraction of light associated with dipole emission 34 is propagated upwards out of the plane of the layers (i.e. approximately along the Z-direction) or down to be reflected back upwards (reflected light 39). In a BE device, the dipole emissions 34 may be reflected off a reflective top reflector and directed through a partially transparent bottom reflector and substrate. In contrast with the first and second representative dipoles, the third representative dipole 36z with the axis 38z oriented in the Z-direction has most of the associated dipole emission directed within a plane parallel to the layers of the light-emitting device structure (X-Y plane). As the layers forming the light-emitting device may be characterized by a high refractive index, waveguide modes are excited that do not propagate out of the layers, and the light 40 associated with light emission from the third representative dipole 36z is subsequently lost, which undermines the light emission efficiency.

Additional modes related to surface plasmon (SPPs) formation are more strongly coupled by the light 40, meaning that one dipole axis constituting approximately one-third of the light emission is almost completely lost, which undermines light emission efficiency further. Furthermore, a portion of light emitted from the first representative dipole 36x oriented in the X-direction and from the second representative dipole 36y oriented in the Y-direction (typically greater than 50%) may excite additional waveguide modes associated with the X and Y axes, which also result in a portion of lost light and reduced efficiency. Thus, a large fraction of the generated light (typically greater than 70%) is lost in structures with unaligned dipoles resulting in an overall optical extraction efficiency of emitted light less than 30%. The loss of light emitted at high angles of incidence with respect to the plane of the layer structure forms one of the major issues in the efficiency of a QLED display.

Figure 5B:
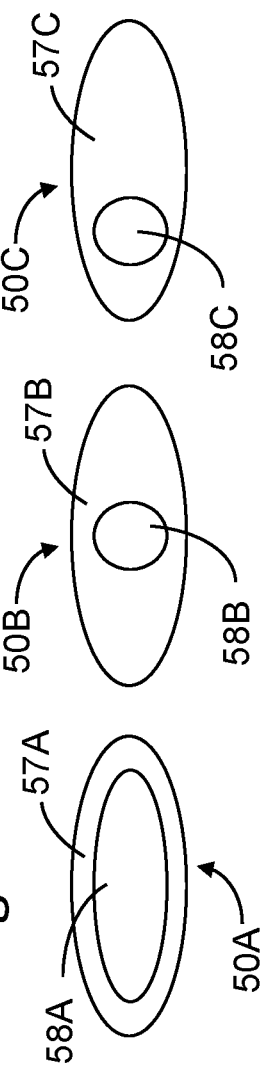
Figure 5A:
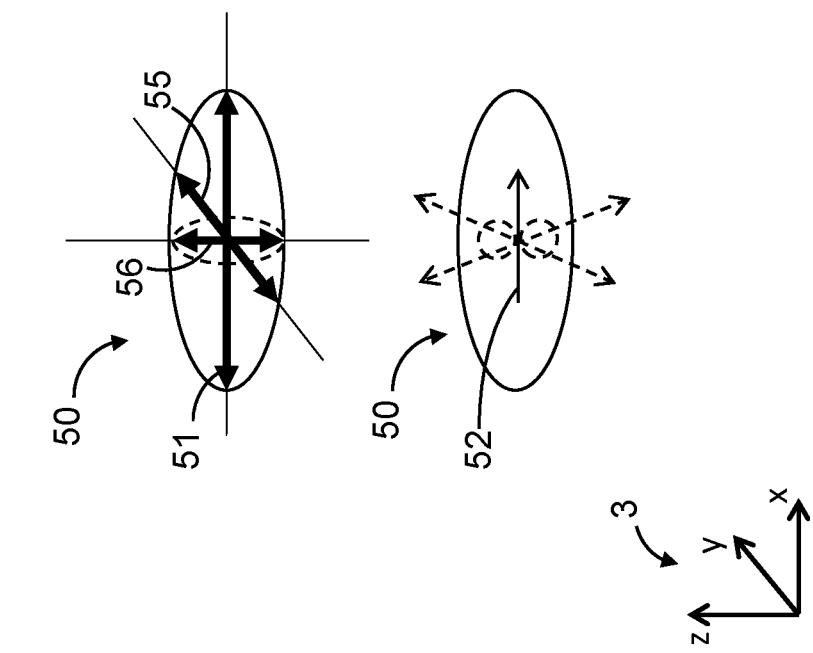

FIGS. 5A-5E are drawings depicting configurations of a light-emitting device structure 53 that employs asymmetrical quantum dots (AQDs) in the emissive layer in accordance with embodiments of the present invention to improve the efficiency of a QLED display. FIG. 5A shows an exemplary AQD 50 characterized by a major axis 51 aligned with the X-axis, which is parallel to a plane of the emissive layer. AQDs thus have one axis, i.e., the major axis 51 in FIG. 5A, that is significantly longer in one direction than axes in the two alternative directions shown by a first minor axis 55 and a second minor axis 56 normal to the major axis 51. Dipoles formed in AQDs will have a dipole axis 52 that is strongly aligned with the major axis 51 of the AQD 50 in the long direction. The dipole axis 52 aligns with the major axis 51 because the lowest energy states of free electrons and holes in AQDs will have wavefunctions along this axis. This type of AQD may also be referred to as a nanowire or a quantum "dash" or quantum rod.

FIG. 5B illustrates various AQD configurations. AQDs may comprise a semiconductor core-shell structure in which one or more semiconductor materials forms a shell layer 57 surrounding a semiconductor core 58. The core 58 is preferably a semiconductor material with a narrower band gap than that of the semiconductor material of the shell layer 57. The conduction band energy of the shell layer 57 may be higher than the conduction band energy of the core 58 such that it is energetically favorable for an electron to be confined mostly within the core 58 and the valence band energy of the shell layer 57 may be lower than the valence band energy of the core 58 such that it is energetically favorable for a hole to be confined mostly within the core.

Alternatively, the conduction band energy of the shell layer 57 may be lower than the conduction band energy of the core 58 such that it is energetically favorable for an electron to be confined mostly within the shell layer 57 and the valence band energy of the shell layer 57 may be lower than the valence band energy of the core 58 such that it is energetically favorable for a hole to be confined mostly within the core 58.

Alternatively, the conduction band energy of the shell layer 57 may be higher than the conduction band energy of the core 58 such that it is energetically favorable for an electron to be confined mostly within the core and the valence band energy of the shell layer 57 may be higher than the valence band energy of the core 58 such that it is energetically favorable for a hole to be confined mostly within the shell layer 57.

As shown in cross-sectional drawings in FIG. 5B, a first AQD 50A may have a core 58A with similar dimensions as the shell 57A in directions of the major axis and the two minor axes. In a second AQD 50B, the shell layer 57A may have a larger thickness than the core 58B along a direction parallel to the major axis such that the AQDs shell layer 57B is significantly longer parallel to the major axis than the core 58B. Alternatively, a third AQD 50C may have a core 58C positioned along the major axis and not aligned with a center point of the AQD 50C.

FIG. 5C illustrates a layer structure of a light-emitting device 53 with an increased efficiency formed using AQDs. In particular, the light-emitting device 53 has certain layers that are comparable as in the conventional configurations of FIGS. 1 and 2, and thus like layers are identified with like reference numerals. In accordance with embodiments of the present application, the light-emitting device 53 further includes an emissive layer 54 that contains AQDs having the properties illustrated in FIG. 5A. FIG. 5D illustrates a close-up view of a portion of the emissive layer 54 as indicated by the oval indicator in FIG. 5C, and FIG. 5E illustrates a top-down sectional view of the emissive layer 54 along the direction illustrated by the arrows in FIG. 5C.

As illustrated in FIG. 5D, the emissive layer 54 is formed with AQDs aligned within the X-Y plane of the emissive layer 54. For example, a dipole axis 52a of a first AQD 50a, a dipole axis 52b of a second AQD 50b, and a dipole axis 52c of a third AQD are aligned with the X-Y plane of the emissive layer 54. As shown the top view of FIG. 5E, the dipole axes 52 of the AQDs 50 do not need to be oriented in the same direction within X-Y plane parallel to the emissive layer. In other words, the dipole axes 52 of the AQDs 50 can be randomly oriented in the X-Y plane, so long as the dipole axes generally are within the plane of the emissive layer 54. The alignment of the dipole axes 52 within the X-Y plane of the emissive layer 54 minimizes the emission associated with dipoles aligned with the Z-axis, which increases light emission efficiency as further detailed below.

FIG. 6 is a drawing depicting dipoles of AQDs aligned in various directions. The layer structure of the light-emitting device 53 is shown with three representative AQDs 50 in the emissive layer 54, although it will be appreciated that the AQDs are not illustrated to scale and the emissive layer 54 will have a composition including far more numerous AQDs. Each AQD 50 represents each of the three orthogonal polarisation positions mentioned above as an alternative understanding of a set of random dipole directions. A first AQD 50x has a dipole axis 52x aligned with a plane formed by the emissive layer 54 parallel to a plane formed by the X-axis and the Y-axis of the coordinate system 3. A second AQD 50y has a dipole axis 52y aligned with the Y-axis of the coordinate system 3. A third AQD 50z has a dipole axis 52z aligned with the Z-axis of the coordinate system 3. In this configuration, with the use of AQDs resulting in two dipole axes aligned within the X-Y plane, the Z-axis emission is minimized, which reduces light emitted by the AQDs that is trapped by the waveguide effect of Z-axis alignment. The emission from the AQD 50x with the dipole axis 52x aligned with the X-axis and the AQD 50y with the dipole axis 52y aligned with the Y-axis contribute to emission, and this are strongly outcoupled.

For the structure shown in FIG. 6, AQDs 50x, 50y with long axes, and hence the dipole direction, in the X-Y plane of coordinate system 3, an increased extraction efficiency is obtained. The structure of FIG. 4 for symmetric QDs has ⅓ emission in each of the polarization modes. However, for the X and Y orientations, approximately 50% of the emission is extracted (i.e., not coupled to a waveguide mode, ignoring other losses), and for the Z orientation, almost no light is extracted. Thus a typical extraction of (⅔)×50%=33% is observed. For the structure of FIG. 6, no Z axis emission is made so the total extraction efficiency is now 50%, a significant increase in efficiency.

This is a change only in the material of the QD layer, so further known extraction improvements such as cavity design etc. would improve the extraction still further. One of ordinary skill in the art would recognize many variations, modifications, and alternatives.

Figure 7A:
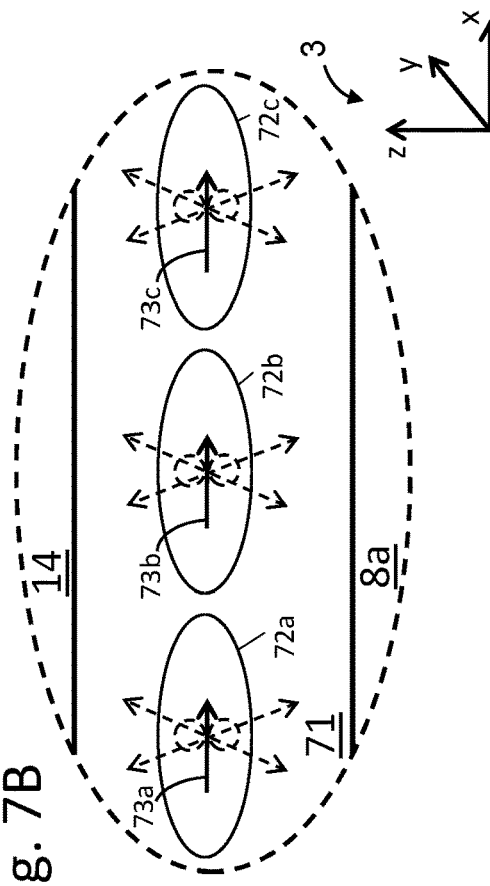
FIGS. 7A, 7B, and 7C are drawings depicting polarized emission in accordance with embodiments of the present invention.
Figure 7B:
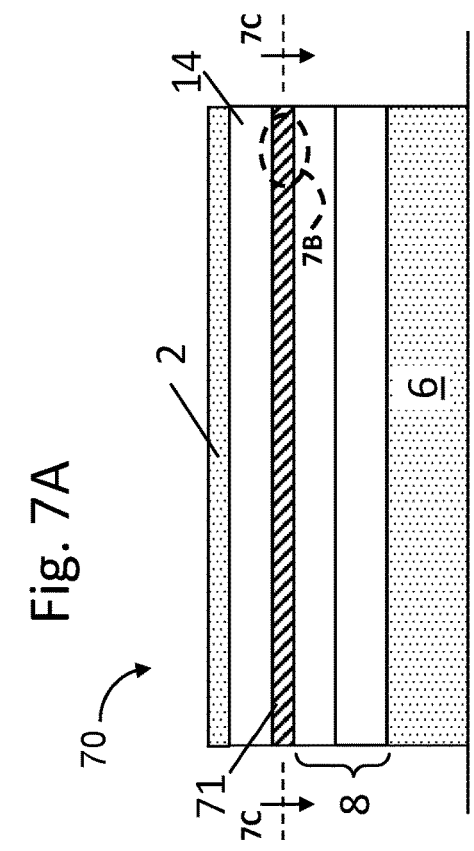
Figure 7C:
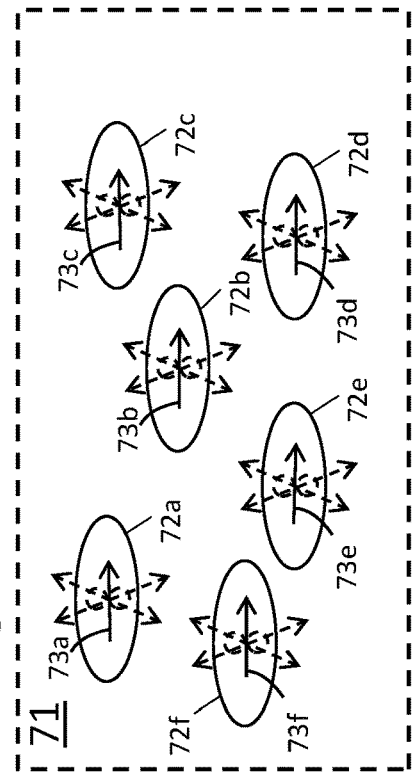

FIGS. 7A-7C are drawings depicting polarized emission in accordance with embodiments of the present invention. FIGS. 5D and 5E show the primary embodiment where alignment if the AQDs is within the X-Y plane of coordinate system 3 (e.g., the plane of the EML). FIG. 7A shows a layer structure 70 with an EML 71 formed using AQDs that are aligned in a single direction within a plane formed by the EML 71. The AQDs are still aligned within the X-Y plane but are now aligned in one direction (for example the X direction) within the X-Y plane. The light-emitting device 70 has layers that are comparable as in the conventional configurations of FIGS. 1 and 2, and thus like layers are identified with like reference numerals. FIG. 7B is a close-up view of a portion of the emissive layer 71 as indicated by the oval indicator in FIG. 7A, which shows the alignment of the AQDs 72 in a first direction parallel to a plane defined by the EML 71 using a side view the EML 71 of the layer structure 70. The dipole axes 73 are parallel to the X-Y plane of the coordinate system 3, comparably as described above with respect to the AQDs illustrated in FIGS. 5A and 5B. FIG. 7C illustrates a top-down sectional view of the emissive layer 71 along the direction illustrated by the arrows in FIG. 7A. FIG. 7C shows the alignment of the AQDs 72 in a second direction within the plane defined by the EML 71 using a top view of the EML 71 of the layer structure 70. The alignment of the embodiment of FIG. 7C may be compared with the alignment as shown in the previous embodiment of FIG. 5D. In the embodiment of FIG. 7C, in contrast, in addition to being parallel to the X-Y plane, the EML layer 71 may be formed with essentially all the dipole axes 73 oriented specifically parallel to the X-axis in the X-Y plane. The dipoles axes, therefore, are aligned in two directions, i.e., parallel to the EML layer 71 and to a second direction, i.e., the X axis (in contrast to FIG. 5C in which the orientation of the dipole axes within the X-Y plane may vary). In the layer structure 70 with an EML layer 71 with AQDs aligned in the plane defined by the EML and parallel to the X-axis, the light emission from the layer structure 70 is polarized. A cavity associated with the layer structure 70 may be designed to propagate polarized light in a particular direction.

A layer structure 70 configured for polarized emission may be used as a backlight for an LCD display. The LCD display may be designed to combine the polarized emission with polarization optics for improved performance such as an increased contrast, reduced ambient reflections, and the like. Aligned AQDs arranged in patterned directions may be implemented in a number of directional applications such as in automotive applications (e.g., glare reduction on the windscreen), as well as three-dimensional, augmented reality, and virtual reality applications, and the like.

Figures 8C, 8D:
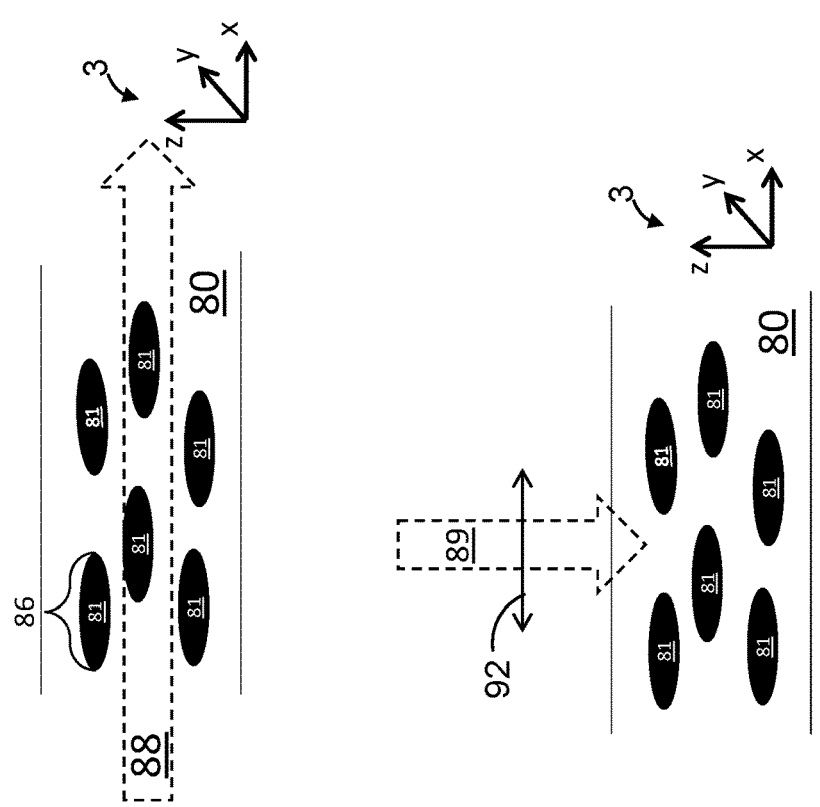

FIGS. 8A-8E depict various configurations of asymmetrical quantum dots in accordance with embodiments of the present invention, and method of forming the associated emissive layers. FIG. 8A shows a method of forming an EML 80 of a layered structure with AQDs 81 aligned in at least one direction in accordance with embodiments of the present invention, similarly as illustrated in FIGS. 5D and 5E. The AQDs 81 may be provided in a solution 82 (i.e. distributed in a solvent). Optionally the AQDs 81 include ligands which facilitate distribution of the AQDs 81 within the solvent. In the solution 82, the AQDs 81 may have a random orientation. To form an EML 80 comprising AQDs aligned in at least one direction, the solution 82 of AQDs 81 may be deposited by any suitable deposition process 83a (e.g. spin coating, ink jet printing or evaporation) to form a thin layer on an existing layer 84, such as a charge transport layer. The thin layer may be characterized by a thickness 85 that is less than a length of the major axis 86 of the AQDs 81 (said thickness measured after evaporation of the solvent). The height of the thin layer causes the AQDs 81 deposited on the existing layer 84 to be aligned in at least one direction.

FIG. 8B shows curing methods to form an EML 80 of a layered structure with AQDs 81 aligned in at least one direction in accordance with embodiments of the present invention. The methods of forming the EML 80 include depositing the solution 82. A first method of deposition 83b involves one or more curing steps that cause the AQDs 81 to settle from a region 87a to a bottom portion of the EML 80 becoming horizontal and aligning the major axis 86 with at least one direction of the EML 80. A second method of deposition 83c involves AQDs 81 dissolved in a host medium with an activator for polymerization of the host medium. On coating, the AQDs 81 float from a region 87b to a top portion of the EML (e.g., farthest from the substrate), becoming horizontal and aligning the major axis 86 with at least one direction of the EML 80. The host medium is then cured to keep the AQDs in place.

FIG. 8C shows an alternative method of fabrication to form the EML layer 80 in which the AQDs 81 may be aligned in a first direction parallel with a plane of the EML layer and a second direction, e.g., the X-axis, as illustrated in FIGS. 7B and 7C. After deposition process 83d of the solution 82, the EML 80 may be placed in an electric field 88 in a direction parallel with the plane of the EML while curing the solution. The electric field 88 may be characterized by one or more field lines, wherein the field lines may be aligned in a specific direction. The field lines may be aligned parallel with the layer structure of the light-emitting device, and the electric field 88 causes the major axis 86 of the AQDs 81 to be aligned in both the X-Y plane and along the X-axis of coordinate system 3. As a result, the EML 80 may be configured to emit polarized light. Subjecting the EML layer to such an electric field 88 is a method that can be used to provide thicker emissive layers using more than a single layer of AQDs 81 and to orient particles aligned in the same plane for polarized emission. Although described using an electric field, a magnetic field may be used to form an EML with one or more layers of aligned AQDs 81.

FIG. 8D shows another method of fabrication to form the EML layer 80 in which the AQDs 81 may be aligned in two directions, again similarly as illustrated in FIGS. 7B and 7C. After deposition process 83e of the solution 82, the AQDs 81 in the EML layer 80 may be subjected to polarized incident light 89 with a polarization 92 parallel to the X-axis of coordinate system 3. during the curing process. The polarized incident light 89 causes the AQDs 81 to align in a first direction parallel to the X-Y plane and a second direction, e.g., the X-axis of coordinate system 3. As a result, the EML 80 may be configured to emit polarized light. Subjecting the EML 80 to polarized incident light 89 is a method that provides thicker emissive layers using more than a single layer of AQDs 81 and orients particles aligned in the same plane for polarized emission.

FIG. 8E shows another method of fabrication to form the EML layer 80 in which the AQDs 81 may be aligned using surface structures 90, again similarly as illustrated in FIGS. 7B and 7C. The AQDs 81 may be aligned by structures 90 formed on a surface 91 of the existing layer 80. The structures 90 may be formed by deposition, roughening of the surface 91, and the like. One of ordinary skill in the art would recognize many variations, modifications, and alternatives to form the structures 90. The surface structures 90 force alignment of the AQDs 81 between individual structures to achieve the desired alignment.

An aspect of the invention, therefore, is a light emitting layer structure that improves the optical extraction efficiency using asymmetrical quantum dots aligned with a plane of the layer structure. In exemplary embodiments, a light-emitting layer structure includes a substrate; a first electrode layer deposed on the substrate; a first charge transport layer deposited on the first electrode layer; an emissive layer (EML) deposited on the first charge transport layer; a second charge transport layer deposited on the EML; and a second electrode layer deposited on the second charge transport layer; wherein the EML includes a plurality of asymmetrical quantum dot nanoparticles, and each nanoparticle of the plurality of nanoparticles has a major axis longer than a first minor axis and a second minor axis, both the first minor axis and the second minor axis being orthogonal to the major axis, and wherein the major axis of each of the nanoparticles of the plurality of nanoparticles is aligned parallel to a plane of the EML.

In an exemplary embodiment of the light-emitting layer structure, the major axis of each of the nanoparticles of the plurality of nanoparticles is aligned in a first direction and the first direction is within the plane of the EML, whereby dipole axes of the nanoparticles are within the plane of the emissive layer.

In an exemplary embodiment of the light-emitting layer structure, the first minor axis of each of the nanoparticles of the plurality of nanoparticles further is aligned in a second direction, and the second direction is in the plane of the EML.

In an exemplary embodiment of the light-emitting layer structure, a thickness of the EML layer is less than a length of one or more nanoparticles of the plurality of nanoparticles, wherein the length is measured along the major axis.

In an exemplary embodiment of the light-emitting layer structure, the plurality of nanoparticles are cured to be located adjacent to a surface of the EML.

In an exemplary embodiment of the light-emitting layer structure, the light-emitting layer structure includes one or more structures formed on an interface of the EML and one of the charge transport layers, wherein the one or more structures align the major axes of the plurality of nanoparticles in a common direction.

In an exemplary embodiment of the light-emitting layer structure, a top emitter configuration in which the second electrode layer is partially transparent and the first electrode layer is reflective.

In an exemplary embodiment of the light-emitting layer structure, a bottom emitter configuration in which the second electrode layer is reflective and the first electrode layer is partially transparent.

In an exemplary embodiment of the light-emitting layer structure, wherein first charge transport layer is a hole transport layer that includes a first sub-layer formed on the first electrode layer; and a second sub-layer formed on the first sub-layer.

In an exemplary embodiment of the light-emitting layer structure, the first sub-layer comprises PEDOT:PSS and the second sub-layer includes TFB.

In an exemplary embodiment of the light-emitting layer structure, the first electrode layer is an anode.

In an exemplary embodiment of the light-emitting layer structure, wherein the second charge transport layer is an electron transport layer that comprises nanoparticle Zinc Oxide.

In an exemplary embodiment of the light-emitting layer structure, the second electrode layer is a cathode.

In an exemplary embodiment of the light-emitting layer structure, one or more of the first electrode layer and the second electrode layer comprises Indium Tin Oxide.

In an exemplary embodiment of the light-emitting layer structure, a method of forming an emissive layer (EML) for use in a light-emitting device includes one or more steps such as forming a solution including a plurality of asymmetrical quantum dot nanoparticles, and each nanoparticle of the plurality of nanoparticles has a major axis longer than a first minor axis and a second minor axis, both the first minor axis and the second minor axis being orthogonal to the first direction; depositing the solution on a charge transport layer; and curing the solution to form the EML layer, wherein curing the solution aligns the major axis of each of the nanoparticles of the plurality of nanoparticles substantially parallel to a plane of the EML.

In an exemplary embodiment of the light-emitting layer structure, the solution is deposited in a layer having a thickness that is less than a length of the major axis of the nanoparticles to align the major axis of each nanoparticle of the plurality of nanoparticles in the at least one direction.

In an exemplary embodiment of the light-emitting layer structure, the curing process moves the nanoparticles to be located adjacent to a surface of the EML.

In an exemplary embodiment of the light-emitting layer structure, curing the solution includes applying a stimulus including one of an electric field, a magnetic field, or polarized light to the solution, and the first minor axes of the plurality of nanoparticles further align in a second direction in response to application of the stimulus, and the second direction is substantially parallel to the plane of the EML.

In an exemplary embodiment of the light-emitting layer structure, the method of forming the EML includes forming one or more structures on an interface of the EML and the charge transport layer, wherein the one or more structures align the major axes of the plurality of nanoparticles in the second direction, and the second direction is substantially parallel to the plane of the EML.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to an organic layer structure used for light emitting devices, in particular, for QLED displays. Hardware manufactured using this disclosure may be useful in a variety of fields that use QLED displays including gaming, entertainment, task support, medical, industrial design, navigation, transport, translation, education, and training.

REFERENCE SIGNS LIST

1—light
2—top layer
3—xyz-coordinate system
4—substrate
6—bottom reflector electrode
8—hole transport layer (HTL)
8a—first HTL sub-layer
8b—second HTL sub-layer
10—top-emitting (TE) light-emitting device structure
12—emissive layer (EML)
14—electron transport layer (ETL)
20—bottom emitting (BE) light-emitting device structure
22—bottom electrode layer
24—transparent substrate
26—HTL
28—emissive layer (EML)
30—ETL
31—top reflector electrode
32—quantum dots
33—dipole axis
34—dipole emission
35—optical emission distribution
36x—first representative dipole
36y—second representative dipole
36z—third representative dipole
37—incoherent superposition
38—dipole axis
38x—dipole axis
38y—dipole axis
38z—dipole axis
39—reflected light
40—light
50—exemplary AQD
50a—first AQD
50b—second AQD
50x—first AQD
50y—second AQD
50z—third AQD
51—major axis
52—dipole axis
52a—dipole axis
52b—dipole axis
52c—dipole axis
52x—dipole axis
52y—dipole axis
52z—dipole axis
53—light-emitting device structure
54—emissive layer
55—first minor axis
56—second minor axis
57—shell layer
58—core
70—light-emitting device
71—EML
72—AQDs
73—dipole axes
80—EML
81—AQDs
82—solution 83a—deposition process
83b—first method of deposition
83c—second method of deposition
83d—deposition process
83e—deposition process
84—existing layer
85—thickness
86—major axis
87a—region
87b—region
88—horizontal electric field
89—polarized incident light
90—surface structures
91—surface
92—polarization

What is claimed is:

1. A light-emitting layer structure comprising:
a substrate;
a first electrode layer deposed on the substrate;
a first charge transport layer deposited on the first electrode layer;
an emissive layer (EML) deposited on the first charge transport layer;
a second charge transport layer deposited on the EML; and
a second electrode layer deposited on the second charge transport layer;
wherein the EML includes a plurality of asymmetrical quantum dot nanoparticles, and each nanoparticle of the plurality of nanoparticles has a major axis longer than a first minor axis and a second minor axis, both the first minor axis and the second minor axis being orthogonal to the major axis, and wherein the major axis of each of the nanoparticles of the plurality of nanoparticles is aligned parallel to a plane of the EML.

2. The light-emitting layer structure of claim 1, wherein the major axis of each of the nanoparticles of the plurality of nanoparticles is aligned in a first direction and the first direction is within the plane of the EML, whereby dipole axes of the nanoparticles are within the plane of the emissive layer.

3. The light-emitting layer structure of claim 2, wherein the first minor axis of each of the nanoparticles of the plurality of nanoparticles further is aligned in a second direction, and the second direction is in the plane of the EML.

4. The light-emitting layer structure of claim 1, wherein a thickness of the EML layer is less than a length of one or more nanoparticles of the plurality of nanoparticles, wherein the length is measured along the major axis.

5. The light-emitting layer structure of claim 1, wherein the plurality of nanoparticles are cured to be located adjacent to a surface of the EML.

6. The light-emitting layer structure of claim 1 further comprising one or more structures formed on an interface of the EML and one of the charge transport layers, wherein the one or more structures align the major axes of the plurality of nanoparticles in a common direction.

7. The light-emitting layer structure of claim 1 having a top emitter configuration in which the second electrode layer is partially transparent and the first electrode layer is reflective.

8. The light-emitting layer structure of claim 1 having a bottom emitter configuration in which the second electrode layer is reflective and the first electrode layer is partially transparent.

9. The light-emitting layer structure of claim 1, wherein the first charge transport layer is a hole transport layer that comprises:
a first sub-layer formed on the first electrode layer; and
a second sub-layer formed on the first sub-layer.

10. The light-emitting layer structure of claim 9, wherein the first sub-layer comprises PEDOT:PSS and the second sub-layer comprises TFB.

11. The light-emitting device of claim 9, wherein the first electrode layer is an anode.

12. The light-emitting layer structure of claim 1, wherein the second charge transport layer is an electron transport layer that comprises nanoparticle Zinc Oxide.

13. The light-emitting layer structure of claim 12 wherein the second electrode layer is a cathode.

14. The light-emitting layer structure of claim 1, wherein one or more of the first electrode layer and the second electrode layer comprises Indium Tin Oxide.

15. A method of forming an emissive layer (EML) for use in a light-emitting device comprising the steps of:
forming a solution including a plurality of asymmetrical quantum dot nanoparticles, and each nanoparticle of the plurality of nanoparticles has a major axis longer than a first minor axis and a second minor axis, both the first minor axis and the second minor axis being orthogonal to the first direction;
depositing the solution on a charge transport layer; and
curing the solution to form the EML layer, wherein curing the solution aligns the major axis of each of the nanoparticles of the plurality of nanoparticles substantially parallel to a plane of the EML.

16. The method of forming an EML of claim 15, wherein the solution is deposited in a layer having a thickness that is less than a length of the major axis of the nanoparticles to align the major axis of each nanoparticle of the plurality of nanoparticles in the at least one direction.

17. The method of forming an EML of claim 15, wherein the curing process moves the nanoparticles to be located adjacent to a surface of the EML.

18. The method of forming an EML of claim 15, wherein curing the solution includes applying a stimulus including one of an electric field, a magnetic field, or polarized light to the solution, and the first minor axes of the plurality of nanoparticles further align in a second direction in response to application of the stimulus, and the second direction is substantially parallel to the plane of the EML.

19. The method of forming an EML of claim 15, further comprising forming one or more structures on an interface of the EML and the charge transport layer, wherein the one or more structures align the major axes of the plurality of nanoparticles in the second direction, and the second direction is substantially parallel to the plane of the EML.

* * * * *